United States Patent [19]

Goto

[11] Patent Number: 5,041,739
[45] Date of Patent: Aug. 20, 1991

[54] SUBSTRATE POTENTIAL GENERATING CIRCUIT

[75] Inventor: Hiroyuki Goto, Tokyo, Japan

[73] Assignee: NEC Corporation, Tokyo, Japan

[21] Appl. No.: 566,913

[22] Filed: Aug. 14, 1990

[30] Foreign Application Priority Data

Aug. 14, 1989 [JP] Japan .................. 1-210305

[51] Int. Cl.⁵ .................. H03K 3/01; H03K 5/00; H03K 3/26
[52] U.S. Cl. .................. 307/296.2; 307/296.4; 307/296.6; 307/303
[58] Field of Search ......... 307/296.2, 296.4, 296.5, 307/296.8, 451, 585, 242, 542, 317.1, 303, 304, 296.6; 365/189.9

[56] References Cited

U.S. PATENT DOCUMENTS

| | | | |
|---|---|---|---|
| 4,433,253 | 2/1984 | Zapisek | 307/296.2 |
| 4,491,746 | 1/1985 | Koike | 307/296.2 |
| 4,670,669 | 6/1987 | Cottrell et al. | 307/296.2 |
| 4,695,746 | 9/1987 | Tobita | 307/296.2 |
| 4,736,121 | 4/1988 | Cini et al. | 307/296.2 |
| 4,740,715 | 4/1988 | Okada et al. | 307/296.2 |
| 4,754,168 | 6/1988 | Liran | 307/296.2 |
| 4,797,001 | 1/1989 | Matsumoto et al. | 365/189.09 |
| 4,843,256 | 6/1989 | Scade et al. | 307/296.2 |
| 4,961,007 | 10/1990 | Kumanoya et al. | 307/296.2 |

FOREIGN PATENT DOCUMENTS 0197929 12/1982 Japan .................. 307/296.2

Primary Examiner—Stanley D. Miller
Assistant Examiner—Trong Phan
Attorney, Agent, or Firm—Sughrue, Mion, Zinn Macpeak & Seas

[57] ABSTRACT

A substrate potential generating circuit of the present invention includes a first charge-pump circuit which produces a higher-potential voltage whose polarity is the same as that of and whose potential is higher than that of the power supply voltage and a second charge-pump circuit to which is supplied as a power source voltage the higher-potential voltage produced by the first charge-pump circuit and which generates a predetermined substrate potential to be supplied to a substrate of a semiconductor integrated circuit. The polarity of the substrate potential is opposite to that of the higher-potential voltage. The circuit of the present invention has enough capability of stably supplying the necessary substrate potential to the substrate without increasing the size of any transistors or capacitor constituting the second charge-pump circuit. In order to enhance the reliability of the circuit, the generating circuit may further comprise a high-potential control circuit which controls a maximum potential of the higher-potential voltage produced by the first charge-pump circuit and then supplied to the second charge-pump circuit as a power source voltage therefor.

8 Claims, 2 Drawing Sheets

SUBSTRATE POTENTIAL GENERATING CIRCUIT

BACKGROUND OF THE INVENTION

The present invention relates to a substrate potential generating circuit and, more particularly, to a substrate potential generating circuit which supplies stably a predetermined potential to a substrate of a semiconductor integrated circuit.

A conventional substrate potential generating circuit of this kind generally comprises: an oscillation circuit for oscillating a signal of a predetermined frequency; a waveform shaping circuit for wave-shaping the signal from the oscillation circuit into a square-wave signal; and a charge-pump circuit for generating a required substrate potential of a negative polarity which is supplied to the substrate of the semiconductor integrated circuit.

It is an essential and important matter that substrate potential generating circuits as explained above have enough capability of stably supplying a substrate potential to the entire substrate of the semiconductor integrated circuit. For this purpose, it has been necessary in the conventional circuit to increase the size of such components as transistors and a capacitor which constitute the charge-pump circuit and also to have the oscillation frequency of the oscillation circuit made comparatively high, thereby causing a disadvantage in that power consumption inevitably increases. Furthermore, the conventional substrate potential generating circuit has a disadvantage in that there is an increase in the current which is necessary for the generating circuit itself to perform a high-speed switching operation, so that the circuit cannot satisfactorily supply a stable substrate potential to the substrate.

SUMMARY OF THE INVENTION

It is, therefore, an object of the present invention to overcome the problems existing in the conventional arrangement and to provide an improved substrate potential generating circuit.

It is another object of the present invention to provide a substrate potential generating circuit which has enough capability of stably supplying a substrate potential to the related substrate without increasing the size of any transistors or capacitors concerned.

It is a further object of the present invention to provide a substrate potential generating circuit which can prevent an increase in the current flowing therein and supply a substrate potential of a high stability to the substrate.

In carrying out the above and other objects of the present invention in one form, there is provided an improved substrate potential generating circuit for generating a predetermined substrate potential supplied to a substrate of a semiconductor integrated circuit, which generating circuit comprising:

an oscillation circuit for oscillating a signal of a predetermined frequency;

a first charge-pump circuit for producing a higher-potential voltage whose polarity is the same as that of and whose level is higher than that of the power supply voltage, the circuit having a first transistor which is turned ON/OFF by the signal from the oscillation circuit; and a second charge-pump circuit for generating the predetermined substrate potential whose polarity is opposite to the higher-potential voltage, the circuit having a second transistor which is turned ON/OFF by the signal from the oscillation circuit and which is supplied with the higher-potential voltage from the first charge-pump circuit as a power source voltage.

The circuit may further comprise a high-potential control circuit which controls a maximum potential of the higher-potential voltage produced by the first charge-pump circuit and supplied to the second charge-pump circuit as a power source voltage.

BRIEF DESCRIPTION OF THE DRAWINGS

The above and other objects, features and advantages of the present invention will be apparent from the following description of preferred embodiments according to the present invention explained with reference to the accompanying drawings, in which.

PREFERRED EMBODIMENTS OF THE INVENTION

Throughout the following explanation, similar reference symbols or numerals refer to the same or similar elements in all the figures of the drawings.

For the purpose of assisting in the understanding of the present invention, a conventional substrate potential generating circuit 10 will first be described by making reference to FIG. 1 before the present invention is explained.

Figure 1:
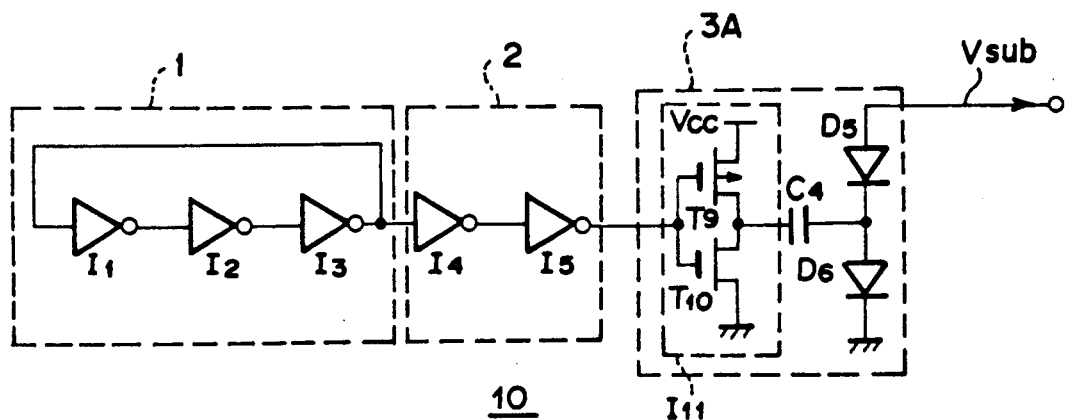
FIG. 1 is a circuit diagram of a typical and conventional substrate potential generating circuit.

The conventional circuit 10 of FIG. 1 comprises: an oscillation circuit 1 which includes odd number of inverters $I_1$-$I_3$ and oscillates a signal of a predetermined frequency; a waveform shaping circuit 2 which includes inverters $I_4$, $I_5$ and shapes the signal from the oscillation circuit 1 into a square-wave signal; and a charge-pump circuit 3A which includes an inverter $I_{11}$ having a complementary pair of transistors $T_9$, $T_{10}$, a capacitor $C_4$ and a serial-connected diodes $D_5$, $D_6$ and which generates a necessary substrate potential $V_{sub}$ of a negative polarity.

In the above conventional circuit, for the purpose of stably supplying the substrate potential $V_{sub}$ to the related semiconductor substrate, the size of such components as the transistors $T_9$, $T_{10}$ and the capacitor $C_4$ constituting the charge-pump circuit 3A has necessarily to be made relatively large and also the oscillation frequency of the oscillation circuit 1 has to be made comparatively high.

Now, the embodiments of the present invention will be described in detail hereinafter with reference to FIGS. 2 to 5.

Figure 2:
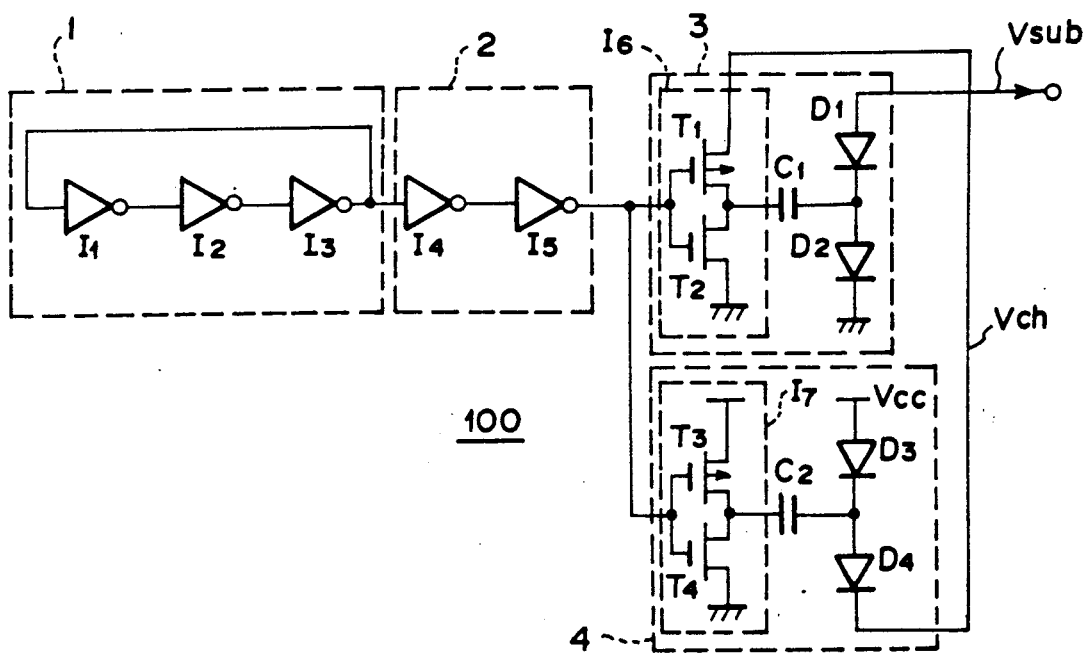
FIG. 2 is a circuit diagram showing a substrate potential generating circuit as a first embodiment according to the present invention.

FIG. 2 shows a circuit diagram of a substrate potential generating circuit 100 as a first embodiment according to the present invention. The circuit 100 of this first embodiment comprises: an oscillation circuit 1 for oscillating a signal of a predetermined frequency; a waveform shaping circuit 2 for wave-shaping the output signal of the oscillation circuit 1 into a square-wave signal; a first charge-pump circuit 4 for producing a higher-potential voltage $V_{ch}$ whose polarity is the same as that of and whose potential is higher (for example, 8 [V]) than that (for example, 5 [V]) of the power supply source $V_{cc}$; and a second charge-pump circuit 3, which receives as a power source voltage therefor the higher-potential voltage $V_{ch}$ produced by the first charge-pump circuit 4, for generating the necessary substrate potential $V_{sub}$ whose polarity is opposite to that of the higher-potential voltage $V_{ch}$. The circuit configurations of the oscillation circuit 1 and the waveform shaping circuit 2 are the same as those in the conventional substrate potential generating circuit 10 shown in FIG. 1. The difference between the circuit 100 of this embodiment and the conventional circuit 10 in FIG. 1 is that the former circuit has the first charge-pump circuit 4 in addition to the second charge-pump circuit 3, whereas the latter circuit has only the charge-pump circuit 3A which corresponds to the second charge-pump circuit 3 of this embodiment.

The first charge-pump circuit 4 comprises: an inverter $I_7$ having a complementary pair of P-type and N-type transistors $T_3$, $T_4$ which are turned ON/OFF by the output signal of the waveform shaping circuit 2; a capacitor $C_2$ having its one end connected to the output node of the inverter $I_7$; a diode $D_3$ having its one end (anode) connected to the power supply source $V_{cc}$ while the other end thereof (cathode) connected to the other end of the capacitor $C_2$; and a diode $D_4$ having its one end (anode) connected to the other end of the diode $D_3$ and generating at the other end thereof (cathode) the higher-potential voltage $V_{ch}$.

The second charge-pump circuit 3, receiving the higher-potential voltage $V_{ch}$ as its power source voltage from the above first charge-pump circuit 4, has substantially the same configurations as that of the first charge-pump circuit 4. That is, the second charge-pump circuit 3 comprises: an inverter $I_6$ having a complementary pair of P-type and N-type transistors $T_1$, $T_2$ which are supplied with the voltage $V_{ch}$, as a power source voltage, from the first charge-pump circuit 4 and which are turned ON/OFF by output signal from the waveform shaping circuit 2; a capacitor $C_1$ having its one end connected to the output node of the inverter $I_6$; a diode $D_2$ having its one end (cathode) grounded and the other end thereof (anode) connected to the other end of the capacitor $C_1$; and a diode $D_1$ having its one end (cathode) connected to the other end of the diode $D_2$ and generating at the other end thereof (anode) the necessary substrate potential $V_{sub}$ of a negative polarity.

According to this embodiment, the amplitude of the output signal appearing at the output node of the inverter $I_6$ in the second charge-pump circuit 3 has been broadened to the range between 0 [V] and $V_{ch}(=8$ [V]), while that appearing at the output node of the corresponding inverter $I_{11}$ in the charge-pump circuit 3A of the conventional circuit 10 was in the range between 0 [V] and $V_{cc}(=5$ [V]). It is, therefore, possible to enhance or improve the capability of supplying a substrate potential of a high stability with the substrate of the semiconductor integrated circuit without increasing the size of such components as the transistors $T_1$, $T_2$ or the capacitor $C_1$ constituting the second charge-pump circuit 3, and also to effectively prevent an increase in the current flowing into and dissipated by the circuit.

Figure 3:
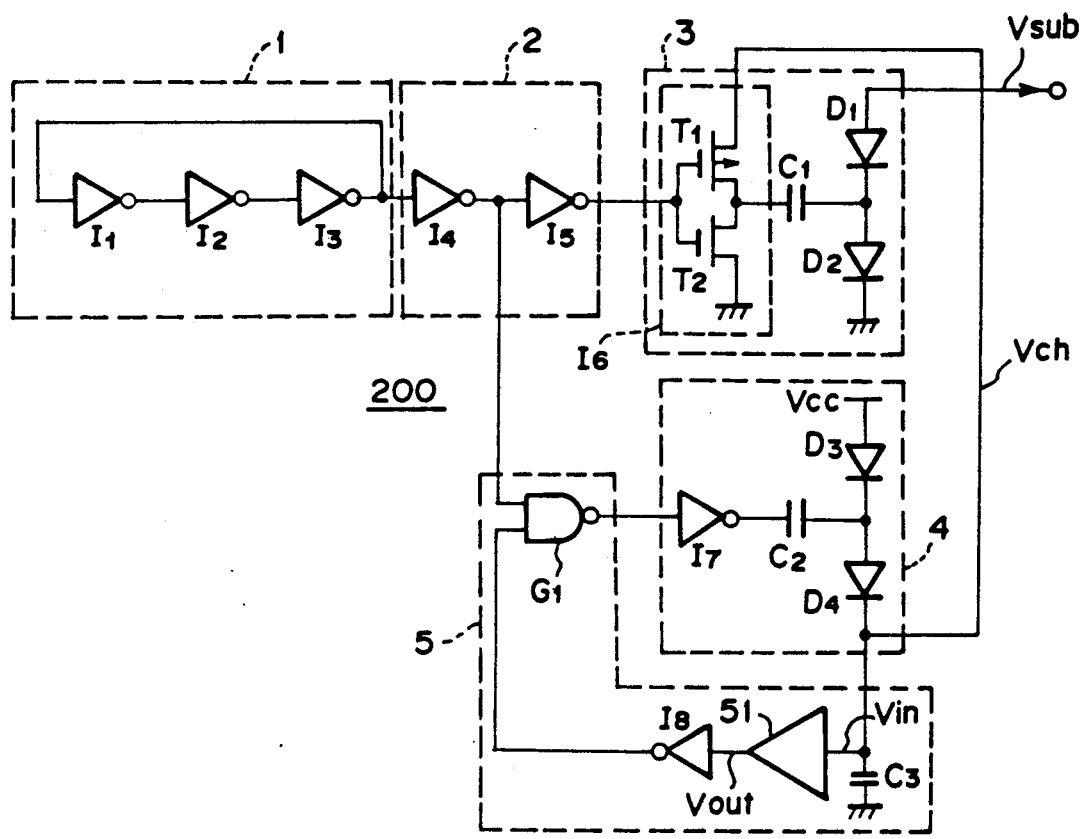
FIG. 3 is a circuit diagram showing a substrate potential generating circuit as a second embodiment according to the present invention.

Next, FIG. 3 shows a circuit diagram of a substrate potential generating circuit 200 as a second embodiment according to the present invention. The circuit 200 of this second embodiment further includes a high-potential control circuit 5 in addition to the respective circuits of the first embodiment as described above and shown in FIG. 2, which prevents the higher-potential voltage $V_{ch}$ produced by the first charge-pump circuit 4 and supplied to the inverter $I_6$ from becoming too high to the extent that it breaks down the transistors $T_1$, $T_2$, thereby highly improving the reliability of the circuit. As the remaining circuits other than this high-potential control circuit 5 are the same as those in the first embodiment, the same explanation therefor is not repeated here.

The high-potential control circuit 5 comprises: a high-potential detection circuit 51 which detects whether the higher-potential voltage $V_{ch}$ produced by the first charge-pump circuit 4 and then forwarded to the second charge-pump circuit 3 exceeds a predetermined voltage $V_{chMAX}$ or not; an inverter $I_5$; and a NAND gate $G_1$ which has its one input terminal connected to the output of the inverter $I_8$ while the other input terminal thereof connected to the output of the inverter $I_4$ in the waveform shaping circuit 2, and the output terminal thereof connected to the input of the inverter $I_7$ in the first charge-pump circuit 4, Whereby the maximum potential of the voltage $V_{ch}$ is controlled in such a manner that the output signal of the waveform shaping circuit 2 is prevented from entering to the charge-pump circuit 4 when the voltage $V_{ch}$ exceeds the predetermined voltage $V_{chMAX}$.

Figure 4:
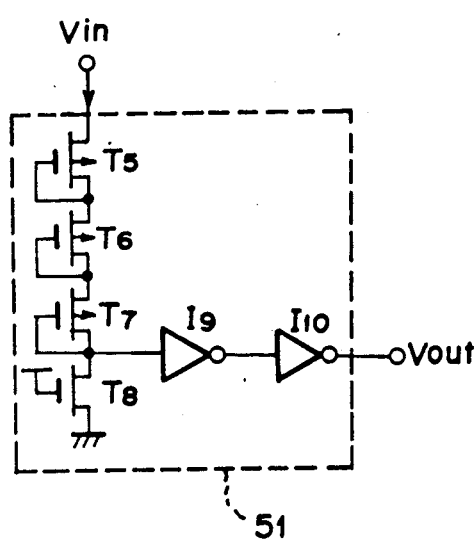
FIG. 4 is a detailed circuit diagram of a high-potential detection circuit, included in the substrate potential generating circuit of the second embodiment, shown symbolically in FIG. 3.

The detailed circuit diagram of the high-potential detection circuit 51 is shown in FIG. 4 as one embodiment thereof. The high-potential detection circuit 51 of the embodiment comprises a plurality of serially-connected P-type transistors $T_5$, $T_6$, $T_7$, an N-type transistor $T_8$ and two inverters $I_9$, $I_{10}$. A capacitor $C_3$ connected between the input terminal and the ground terminal functions to prevent an occurrence of abrupt change of the voltage $V_{ch}$.

Figure 5:
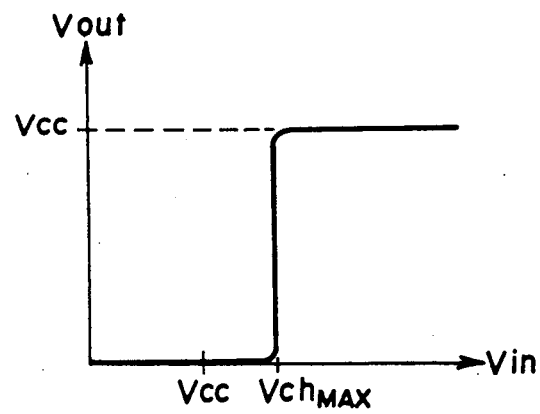
FIG. 5 is a graph showing input-output characteristics of the high-potential detection circuit shown in FIG. 4.

The input-output characteristics between the input voltage $V_{in}$ and the output voltage $V_{out}$ of the high-potential detection circuit 51 are shown in FIG. 5.

While the present invention has been described in its preferred embodiments, it is to be understood that the words which have been used are words of description rather than limitation and that changes within the purview of the appended claims may be made without departing form the true scope and spirit of the invention in its broader aspects.

What is claimed is:

1. A substrate potential generating circuit for generating a predetermined substrate potential which is supplied to a substrate of a semiconductor integrated circuit, said generating circuit comprising:
   an oscillation circuit for oscillating a signal of a predetermined frequency;
   a first charge-pump circuit for producing a higher-potential voltage whose polarity is the same as that of and whose level is higher than that of the power supply voltage, the circuit having a first transistor which is turned ON/OFF by the signal from said oscillation circuit; and
   a second charge-pump circuit for generating said predetermined substrate potential whose polarity is opposite to that of said higher-potential voltage, the circuit having a second transistor which is turned ON/OFF by the signal from said oscillation circuit and which is supplied with said higher-potential voltage from said first charge-pump circuit as a power source voltage.

2. A substrate potential generating circuit according to claim 1, further comprising a waveform shaping circuit for wave-shaping the signal from said oscillation circuit into a square-wave signal and supplying the square-wave signal to said first and second charge-pump circuits.

3. A substrate potential generating circuit according to claim 1, in which said first charge-pump circuit includes:
   a first inverter having a complementary pair of first transistors which are turned ON/OFF by the signal from said oscillation circuit;
   a first capacitor having its one end connected to the output node of said first inverter;
   a first diode having its anode connected to the power supply source and its cathode connected to the other end of said first capacitor; and
   a second diode having its anode connected to the cathode of said first diode as well as the other end of said first capacitor and its cathode coupled to said second transistor of said second charge-pump circuit for supplying said higher-potential voltage thereto.

4. A substrate potential generating circuit according to claim 1, in which said second charge-pump circuit includes:
   a second inverter having a complementary pair of second transistors which are turned ON/OFF by the signal from said oscillation circuit;
   a second capacitor having its one end connected to the output node of said second inverter;
   a third diode having its cathode grounded and its anode connected to the other end of said second capacitor; and
   a fourth diode having its cathode connected to the anode of said third diode as well as the other end of said second capacitor and its anode connected to the substrate of said semiconductor integrated circuit.

5. A substrate potential generating circuit for generating a predetermined substrate potential which is supplied to a substrate of a semiconductor integrated circuit, said generating circuit comprising:
   an oscillation circuit for oscillating a signal of a predetermined frequency;
   a first charge-pump circuit for producing a higher-potential voltage whose polarity is the same as that of and whose level is higher than that of the power supply voltage, the circuit having a first transistor which is turned ON/OFF by the signal from said oscillation circuit;
   a second charge-pump circuit for generating said predetermined substrate potential whose polarity is opposite to that of said higher-potential voltage, the circuit having a second transistor which is turned ON/OFF by the signal from said oscillation circuit and which is supplied with said higher-potential voltage from said first charge-pump circuit as a power source voltage; and
   a high-potential control circuit for controlling a maximum potential of said higher-potential voltage produced by said first charge-pump circuit and then supplied to said second charge-pump circuit as a power source voltage.

6. A substrate potential generating circuit according to claim 5, further comprising a waveform shaping circuit for wave-shaping the signal from said oscillation circuit into a square-wave signal and supplying the square-wave signal to said first charge-pump circuit through said high-potential control circuit and directly to second charge-pump circuit.

7. A substrate potential generating circuit according to claim 5, in which said high-potential control circuit includes:
   a high-potential detection circuit which detects whether the higher-potential voltage produced by said first-charge-pump circuit exceeds a predetermined voltage or not;
   an inverter having its input connected to the output of said high-potential detection circuit; and
   a NAND gate which prevents the signal from said oscillation circuit from entering to said first charge-pump circuit when said high-potential detection circuit detects that the higher-potential voltage exceeds the predetermined voltage.

8. A substrate potential generating circuit according to claim 7, in which said high-potential detection circuit includes a plurality of serially-connected P-type transistors, an N-type transistor and two inverters.

* * * * *